United States Patent [19]

Akao

[11] Patent Number: 5,739,649
[45] Date of Patent: Apr. 14, 1998

[54] FAIL CHECK DEVICE AND METHOD FOR AC MOTOR CONTROL CIRCUIT

[75] Inventor: Norihiko Akao, Nagoya, Japan

[73] Assignee: Toyota Jidosha Kabushiki Kaisha, Toyota, Japan

[21] Appl. No.: 690,817

[22] Filed: Aug. 1, 1996

[30] Foreign Application Priority Data

Sep. 5, 1995 [JP] Japan ................... 7-227824

[51] Int. Cl.$^6$ ..................... H02P 7/63; B60L 3/00
[52] U.S. Cl. .................. 318/139; 318/434; 318/439; 318/811; 318/490
[58] Field of Search .................. 318/138, 139, 318/245, 254, 430–460, 800–838; 324/772, 127, 117 H

[56] References Cited

U.S. PATENT DOCUMENTS

| | | | |
|---|---|---|---|
| 4,924,158 | 5/1990 | Kelley et al. | 318/434 |
| 5,357,181 | 10/1994 | Mutoh et al. | 318/139 |
| 5,469,032 | 11/1995 | Otake | 318/439 |
| 5,568,059 | 10/1996 | Futsuhara et al. | 324/772 |
| 5,598,081 | 1/1997 | Okamura et al. | 318/801 |
| 5,600,218 | 2/1997 | Holling et al. | 318/439 |
| 5,623,190 | 4/1997 | Tajima et al. | 318/800 |

FOREIGN PATENT DOCUMENTS 6-133591 5/1994 Japan.

OTHER PUBLICATIONS

Patents Abstracts of Japan, vol. 18, No. 168, Mar. 22, 1994, JP-A-5-336603, Dec. 17, 1993.

Patent Abstracts of Japan, vol. 18, No. 434, Aug. 12, 1994, JP-A-6 133591, May 13, 1994.

*Primary Examiner*—Paul Ip
*Attorney, Agent, or Firm*—Oblon, Spivak, McClelland, Maier & Neustadt, P.C.

[57] ABSTRACT

A device and method for detecting a failure which are used with an AC motor control circuit to detect a failure in a total of three current sensors correlated to phases U, V, W of a motor. Three types of current paths are formed in order to position two current sensors on each current path while providing an adequate time interval so as not to rotate the motor. By comparing output from each current sensor with a reference value, or by comparing respective output from the two current sensors provided on the same current path, a failure in the respective current sensors is detected. The motor need not be driven in order to detect a fail in the current sensors.

14 Claims, 3 Drawing Sheets

FAIL CHECK DEVICE AND METHOD FOR AC MOTOR CONTROL CIRCUIT

BACKGROUND OF THE INVENTION a) Field of the Invention

This invention relates to a failure check device and method to be used or operated together with an AC motor controller in order to check for failure in current sensors of the AC motor controller.

b) Description of the Related Art

To control each phase current of a multiple phase AC motor, it is preferable to provide current sensors for detecting respective phase currents. However, if such current sensors fail, the control of the current value of a phase correlated to the failed current sensor is affected, and in turn the output of the motor in turn deviates from a control target. A circuit such as a power converter through which drive power is supplied to the motor may often fail and, especially when the used motor is an excited-by-permanent-magnet type motor, its permanent magnets could be demagnetized. In view of above, Japanese Patent Laid-Open Publication No. Hei 6-133591 suggests that, by comparing the output value of the current sensor with a threshold, a failure in the current sensor can be detected. In a case of a balanced multiple phase alternating current, since the total of respective phase currents becomes zero, by adding the output from the current sensors provided for respective phases a fail occurrence can be discriminated.

However, all the above related arts can not be operated unless the motor is being driven. Therefore, when any of the current sensors has a failure at the time of starting the motor, the failure cannot be readily detected and remedied, resulting in the deviation of the motor immediately after the start of the motor output from a target, a failure in the circuit such as the aforementioned power converter, or when the used motor is an excited-by-permanent-magnet type motor, demagnetization of the motor's permanent magnet.

SUMMARY OF THE INVENTION

One of the objects of this invention is to make possible to detect a failure in current sensors without driving a motor, thereby preventing the above-described various disadvantages from occurring, even immediately after starting the motor. According to a preferred embodiment of the invention, this object can be achieved by improving an electrifying method at the time of detecting a failure.

One aspect of the invention relates to a failure check device and another aspect relates to a failure check method to be performed with an AC motor control circuit having m number of current sensors for detecting respective phase currents flowing through an m phase (m: natural number greater than 2) AC motor and means for controlling the respective phase currents of the m phase AC motor based on the detected phase currents. According to a preferred embodiment of the invention, a process of causing a current flow through one or two phases selected from the m phases and receiving the detected current values from the current sensors corresponding to the selected phases is repeatedly performed while changing the phases through which the current is flowing so as not to produce substantial torque (e.g., to prevent an electric vehicle from starting to run).

In detail, according to an embodiment of the invention, a reference-value-to-detected-value comparison process of comparing a reference value representing of the phase current which would be detected when no failure is occurring with the detected value received from the current sensor is performed for each of the current sensors. According to the reference-value-to-detected-value comparison, a failure in each current sensor can be directly, and thus quickly, detected for each phase or each current sensor. According to another embodiment of the invention, a mutual-comparison-between-detected-values process of mutually comparing the detected values received from the current sensors for the selected two phases is performed for each combination of the phases. To perform the mutual-comparison-between-detected-values, e.g., to detect a failure in a current sensor corresponding to a V phase, the result of the mutual-comparison-between-detected-values regarding a combination of U and V phases is compared with a result of performing the-mutual-comparison-between-detected-values regarding a combination of V and W phases. Although, the mutual-comparison-between-detected-values implies rather complicated processes, reference values are not required. The mutual-comparison-between-detected-values can be particularly accurately performed on a balanced m phase alternating current, because the absolute values of currents of respective phases in the balanced alternating current basically become equal. According to still another embodiment of the invention, all the above processes can be performed.

According to the invention, driving the AC motor is not required to detect a failure in the current sensors, enabling a failure in the current sensors to be detected before starting the AC motor preventing the motor output deviates from a target level immediately after it is started.

According to a more detailed embodiment of the invention, since selective test electrifying to each phase and input of detected values from the current sensors are repeated so as not to overlap a phase through which current has already flowed while selecting one or two phases or combinations, a failure in the current sensors can be detected on all m phases by repeating the electrification only m−1 times, namely in a short time. Also, according to a preferred embodiment of the invention, since a process of detecting a failure in the current sensors is performed only after checking that a user has not made the AC motor usable (e.g. in the case where the AC motor is a train motor of an electric vehicle, that the parking brake has not been released), a defect at the start of the motor can be prevented with higher reliability. According to a preferred embodiment of the invention, it is judged that the AC motor can be driven when the AC motor is provided with balanced m phases and m−1 or more of the m current sensors are normal. Specifically, since the total of phase currents must be zero in the balanced m phases, and thus the current flowing through one phase can be derived on the basis of the currents flowing through other m−1 phases, the decision to drive can be made by detecting phase currents of only m−1 phases.

DETAILED DESCRIPTION OF THE PREFERRED EMBODIMENTS

Preferred embodiments of the invention will be described with reference to the accompanying drawings.

Figure 1:
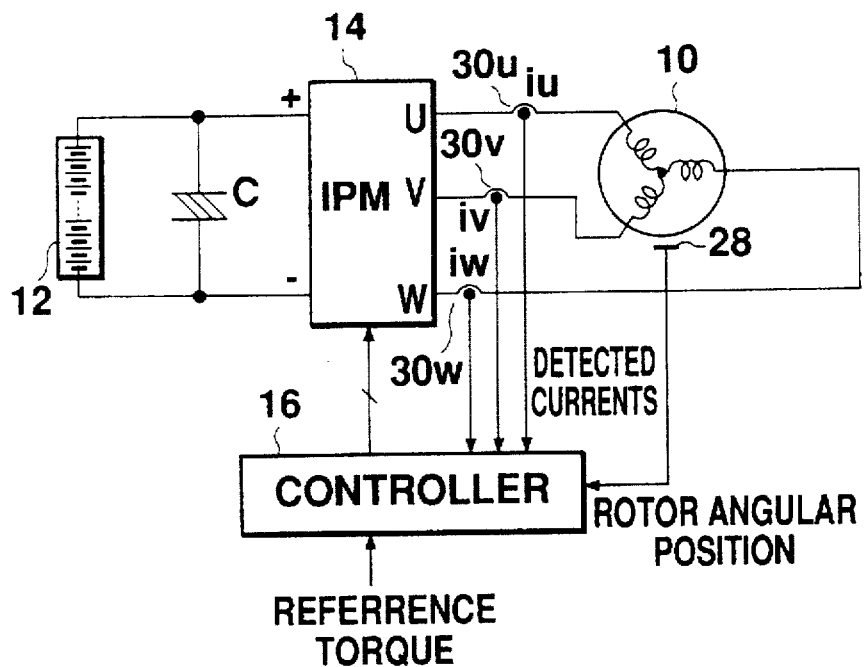
FIG. 1 is a block diagram showing the system configuration of an electric vehicle according to one embodiment of the invention.

FIG. 1 shows the system configuration of an electric vehicle according to one embodiment of the invention. The electric vehicle shown in this drawing is equipped with a balanced three-phase AC motor 10 as a driving motor, a battery 12 and an Intelligent Power Module (IPM) 14 converting the discharged power from the battery 12 into a balanced three-phase alternating current and supplying it as the drive power to the motor 10. Power conversion by the IPM 14 is controlled by a controller 16 which receives reference torque from a non-illustrated circuit, detects the rotor angular position of the motor 10 by a resolver 28 attached to the motor 10, and also detects respective phase currents iu, iv and iw of the motor 10 using three current sensors 30u, 30v and 30w provided in correlation with respective phase windings U, V and W of the motor 10. The controller 16 controls the power conversion by the IPM 14 while surveying output from the resolver 28 and output from the respective current sensors 30u, 30v and 30w so that torque corresponding to the given reference torque is output from the motor 10, by supplying to the IPM 14 a PWM pattern for determining a switching pattern of each switching element configuring the IPM 14. In FIG. 1, C designates a capacitor for smoothing the voltage supplied from the battery 12 to the IPM 14.

Figure 2:
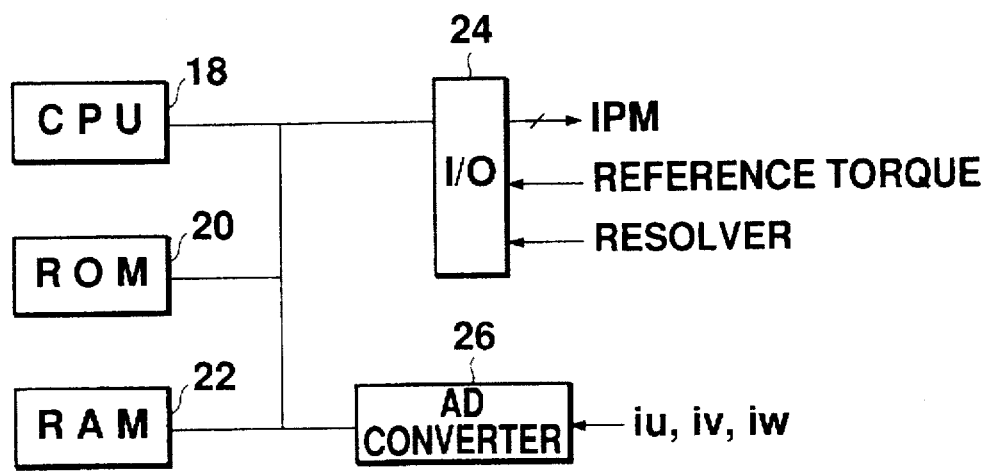
FIG. 2 is a block diagram showing the configuration of a controller in the above embodiment.

FIG. 2 shows the internal structure of the controller 16 comprising a CPU 18, a ROM 20 for storing a program to be run by the CPU 18 and parameters to be used by the CPU 18, a RAM 22 for providing a work area for the CPU 18, an I/O 24 for giving the PWM pattern to the IPM 14 while receiving the reference torque and the output from the resolver 28, and an A/D converter 26 for receiving outputs from the current sensors 30u, 30v and 30w.

Figure 3:
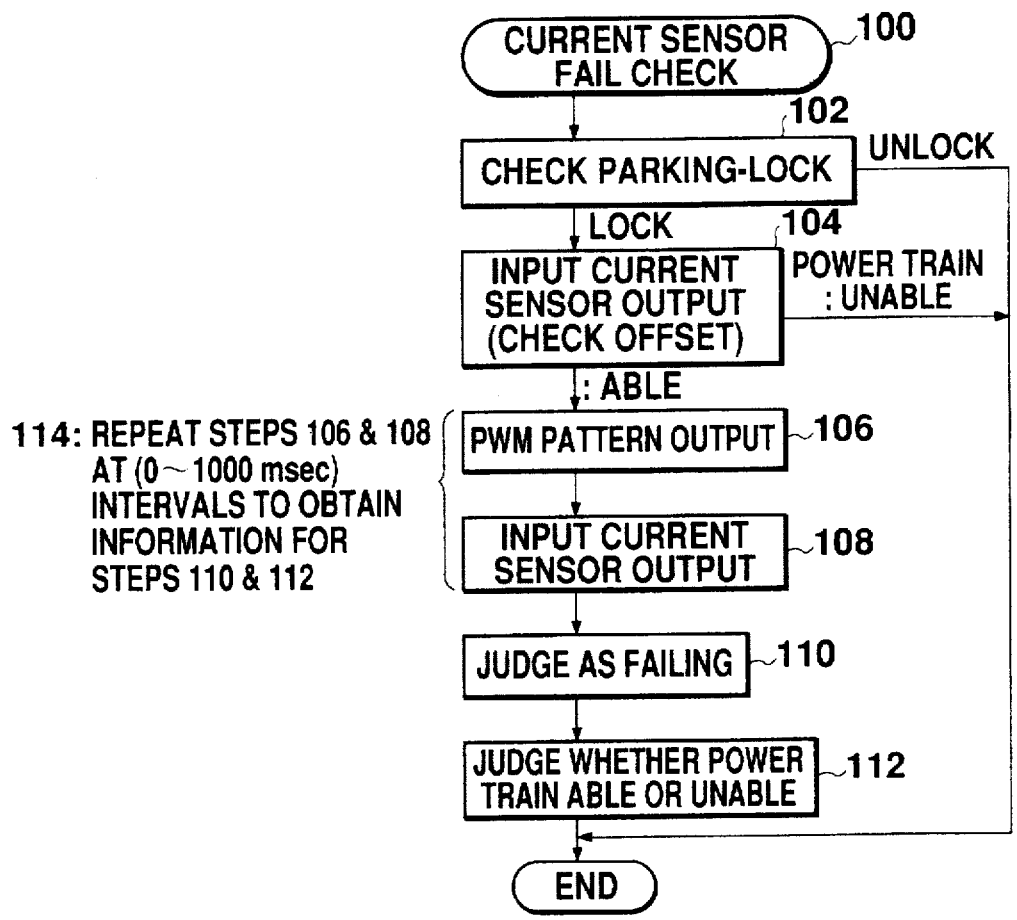
FIG. 3 is a flowchart showing the operation of a CPU in the embodiment.

FIG. 3 shows a flow of the current sensor failure checking sequence to be performed by the CPU 18 in this embodiment. In response to the operation by a user who turns on a non-illustrated ignition switch (100), the CPU 18 starts the current sensor failure checking sequence after first checking that the parking brake has been locked by the user (102). When the parking brake has not been locked, namely when the user is going to drive the motor 10, which is a driving motor, the sequence shown in the drawing is terminated immediately and an alarm is issued to inform the driver of sensor failure. On the other hand, when the parking brake has been locked, it is assumed that the user will not soon drive the motor 10, so operations from step 104 on are performed.

In step 104, the CPU 18 receives the detected current values from the current sensors 30u, 30v and 30w while controlling the IPM 14 so that the currents do not flow through the motor 10. The detected current values are called offsets because they are detected values when currents are not actually flowing. When the offset regarding one phase is larger than a prescribed level, the CPU 18 determines that the corresponding current sensor has a failure. When at least two of the three current sensors 30u, 30v and 30w are detected having a failure in their offsets, the CPU 18 judges that the motor 10, and thus the vehicle, cannot, realize the reference torque correctly, and terminates the sequence shown in FIG. 3 and issues the sensor-failure alarm. Otherwise, the process continues to steps 106 on.

Figure 4:
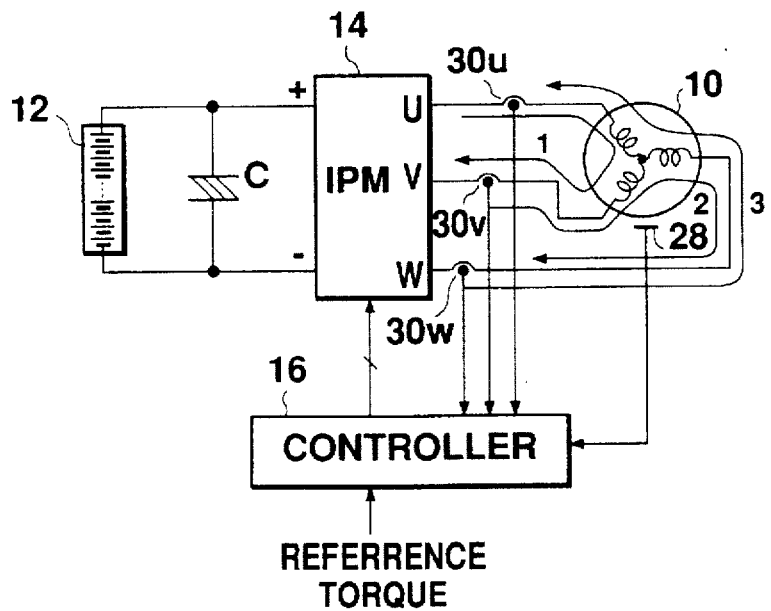
FIG. 4 is a schematic view showing current paths in the embodiment.

The CPU 18 outputs a prescribed PWM pattern to the IPM 14 in step 106, and receives outputs from the current sensors 30u, 30v and 30w while continuing the control using the PWM pattern in step 108. For example, there may be three possible output patterns in step 106 which form current paths designated by reference numerals 1 to 3 as shown in FIG. 4. In FIG. 4, the current path 1 passes U and V phases, the current path 2 passes V and W phases, and the current path 3 passes W and U phases. It is assumed that PWM patterns for achieving these current paths 1 to 3 are represented as patterns 1 to 3, and the outputs from the current sensors 30u, 30v and 30w which are received in step 108 are represented as Ius, Ivs and Iws. Then, the types of PWM patterns to be outputted to the IPM 14 in step 106 and the quantity which the controller 16 can receive in step 108 have relationships as shown in Table 1. For example, when the IPM 14 is controlled according to the pattern 1, the controller 16 can receive Ius and Ivs from the current sensors 30u and 30v.

TABLE 1

First Fail Check Algorithm

|  | Ius | Ivs | Iws |
|---|---|---|---|
| Pattern 1 | Input permitted | Input permitted |  |
| Pattern 2 |  | Input permitted | Input permitted |
| Pattern 3 | Input permitted |  | Input permitted |

The CPU 18 repeats the operations of steps 106 and 108 at an interval of, e.g., 10 to 1000 ms while varying the PMW patterns to be outputted in step 106. Such a long time interval of 10 to 1000 ms is useful to prevent the motor 10 from being applied with substantial torque. Namely, in this embodiment, even though the motor 10 is electrified in step 106, rotation can be prevented. The number of repetitions of steps 106 and 108, and thus the number of patterns to be used is determined so as to enable failure checking in step 110.

In step 110, whether a failure is presented in the current sensors 30u, 30v and 30w is judged based on the principles shown in FIG. 5, Table 1 or a combination thereof with the details of the principles as follows.

Figure 5:
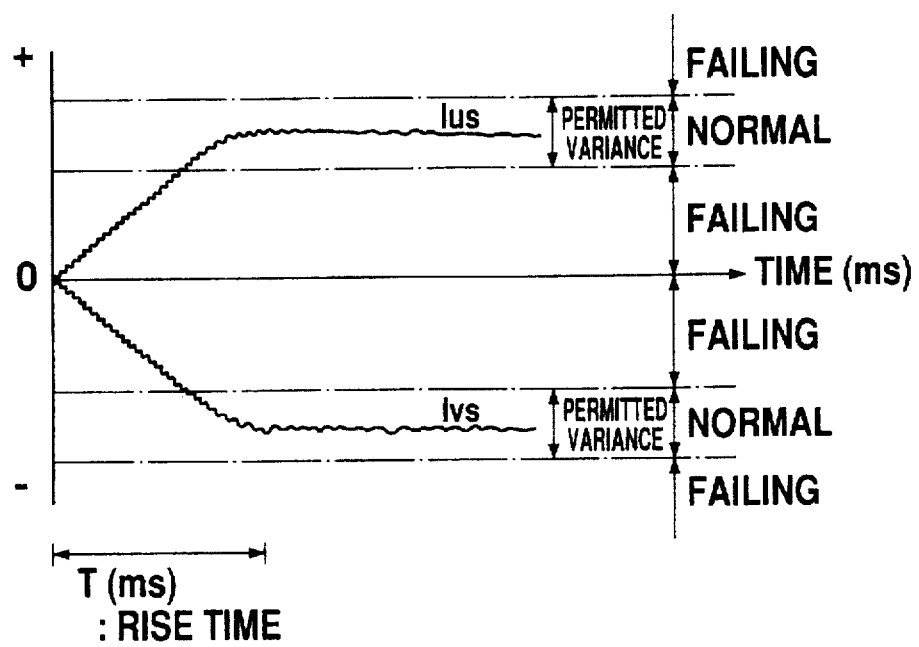
FIG. 5 is a timing chart showing one example of the fail checking principle of a current sensor.

For example, when controlling the IPM 14 according to pattern 1, as shown in FIG. 5, the output Ius from the current sensor 30u will be saturated at a certain value after a lapse of a rise time T (ms) which is determined according to the resistance and inductance of each phase winding of the motor 10. Therefore, by previously measuring the value of the output Ius when the current sensor 30u is normal and thereafter performing steps 106 and 108, the failure occurrence in the current sensor 30u can be detected according to whether the output Ius from the current sensor 30u reaches a certain saturation current with the permitted variance. Further, since the sensor output Ius, Ivs and Iws can be obtained by supplying currents through any two of the current paths 1 to 3 shown in FIG. 4, to use the principle shown in FIG. 5 it is sufficient to perform steps 106 and 108 on any two among the three types of current paths shown in FIG. 4.

A failure checking principle, which can be used in step 110 instead of, or in combination with, the principle shown in FIG. 5 is shown in Table 2. Specifically, since a balanced three-phase alternating current is used in this embodiment, when current is flowing through the current path 1, for example, and the current sensors 30u and 30v are normal, |Ius+Ivs| is ideally zero. Therefore, by repeatedly performing steps 106 and 108 so that the IPM 14 is controlled according to the patterns 1 to 3 in this order and judging in step 110 whether each of |Ius+Ivs|, |Ivs+Iws| and |Iws+Ius| has a prescribed value, the occurrence of a fail in the respective current sensors 30u to 30w can be detected according to a combination of respective judged results as shown in Table 2. Since a situation that any two among the three indexes in Table 2 are judged to be "o" and the remaining one is judged to be "x" does not take place principally, the CPU 18 repeats steps 106 through 110 again if such a situation is found.

TABLE 2

Second Fail Check Algorithm

| |Ius + Ivs| | |Ivs + Iws| | |Iws + Ius| | Fail qt. | Running |
|---|---|---|---|---|
| o | o | o | (All normal) | Able |
| o | x | x | Iws | Able |
| x | o | x | Ius | Able |
| x | x | o | Ivs | Able |
| o | o | x | (Recheck required) | |
| o | x | o | (Recheck required) | |
| x | o | o | (Recheck required) | |
| x | x | x | (2 or 3) | Unable |

Legends:
o = Normal (or small)
x = Fail (or large)

After completing step 110, the CPU 18 judges whether the vehicle can be driven by the motor 10 (step 112). First, when it is judged in step 110 that all of the three current sensors 30u, 30v and 30w are normal, their outputs can be used to normally control the IPM 14, so the CPU 18 judges that the vehicle can be driven. Next, when it is judged in step 110 that only one of the current sensors is failing, the CPU 18 judges that the IPM 14 can be controlled by the output from the remaining two current sensors and, therefore, the vehicle can be driven by the motor 10. This results from the fact that, in the balanced three-phase alternating current used in this embodiment, a total of respective phase currents is zero, so that when two current sensors are normal, the current value of the remaining one phase can be determined based on the output from the normal two-phase current sensors. Finally, when two or more of the three current sensors are judged to have a failure, the CPU 18 judges that driving the vehicle with such the failed sensors be permitted because of the motor 10. When vehicle driving cannot been permitted, the CPU 18 issues an alarm informing the vehicle driver that the vehicle cannot be driven.

The above description has been made on an example of applying this invention to the motor on an electric vehicle, but this invention can also be applied to other AC motors. In addition, the invention can be applied to multiple phase alternating currents other than three-phase alternating current. The principle shown in FIG. 5 is also applicable to unbalanced multiple phase alternating currents. In step 106, current flowing through the motor 10 preferably has a very small value in order to suppress battery discharge.

While there have been described that which are at present considered to be preferred embodiments of the invention, it is to be understood that various modifications may be made thereto, and it is intended that the appended claims cover all such modifications as fall within the true spirit and scope of the invention.

What is claimed is:

1. A failure check device which is used together with an AC motor controller, said AC motor controller being provided with m, where m is a natural number greater than 2, number of current sensors for detecting respective phase currents passing through an AC motor having m phases and means for controlling each phase current of said AC motor based on phase currents detected by said current sensors, said failure check device comprising:

test electrifying means for supplying current to one or two phases selected from the m phases, current input means for receiving said phase currents detected by the current sensor or sensors correlated to selected phase or phases when said test electrifying means are operating, repetition means for operating said test electrifying means and said current input means while changing the selected phase or phases through which a phase current flows so as not to produce substantial torque, and comprehensive means for detecting a failure in each of said m number of current sensors by comparing a reference value representative of a phase current which would be detected when a corresponding current sensor has not failed with the phase current in the corresponding phase input by said current input means.

2. A failure check device which is used together with an AC motor controller, said AC motor controller being provided with m, where m is a natural number greater than 2, number of current sensors for detecting respective phase currents passing through an AC motor having balanced m phases and means for controlling each phase current of said AC motor based on phase currents detected by said current sensors, said failure check device comprising:

test electrifying means for supplying current to two phases selected from the m phases, current input means for receiving said phase currents detected by current sensors correlated to selected two phases when said test electrifying means are operating, repetition means for operating said test electrifying means and said current input means while changing the combination of the selected two phases through which a phase current flows so as not to produce substantial torque, and comprehensive means for comparing the phase currents input by said current input means at one time with each other and comparing results of phase current comparison with each other in order to detect a failure within said m number of current sensors.

3. The failure check device according to claim 2, wherein said comprehensive means comprises:

first detection means for detecting a failure in each of said m number of current sensors by comparing a reference value representative of a phase current which would be detected when a corresponding current sensor has not failed and a phase current received by said current input means, second detection means for detecting a failure regarding each of a plurality of combinations of the selected two phases by comparing said phase currents received by said current input means with each other, and means for detecting a failure in each of said m number of current sensors by combining failure information detected by said first and second detection means.

4. A failure check method, which is performed on an AC motor control circuit for controlling each phase current of an AC motor based on phase currents detected by current sensors for detecting respective phase currents flowing through said AC motor having m phases (m: natural number greater than 2), said failure check method comprising:

a first step of flowing phase currents through one or two phases selected from said m phases, a second step of detecting phase current or currents of selected phase or phases by one or two current sensors corresponding to said selected phase or phases, a third step of repeatedly performing the first and second steps while changing the selected phase or phases through which phase current or currents flow so as not to produce substantial torque, and a fourth step of detecting a failure in a total of m number of current sensors which are provided to correspond to each of said m phases by comparing phase current or currents detected by said one or two current sensors in the second step with a reference value representative of a phase current which would be detected when a corresponding current sensor has not failed.

5. A failure check method, which is performed on an AC motor control circuit for controlling each phase current of an AC motor based on phase currents detected by current sensors for detecting respective phase currents flowing through said AC motor having balanced m phases (m: natural number greater than 2), comprising:

a first step of supplying phase currents through two phases selected from said m phases, a second step of detecting a phase current of the selected two phases by two current sensors corresponding to said two phases, a third step of performing the first and second steps while changing the combination of two phases through which phase currents flow so as not to produce substantial torque, and a fourth step of detecting a failure in a total of m number of current sensors which are provided to correspond to each of said m phases by repeatedly executing for each combination of said current sensors a process of comparing the phase currents detected by said current sensors in the second step in order to detect a failure in either of or both of said two current sensors.

6. The failure check method according to claim 5, wherein said fourth step comprises:

a first sub-step of comparing, for each of the current sensors, the phase currents detected by said current sensors in the second step and a reference value representative of a phase current which would be detected when a corresponding current sensor has not failed, a second sub-step of executing, for each combination of the current sensors, a process of comparing the phase currents detected by said current sensors in the second step with each other in order to detect a failure in either of or both of said two current sensors, and a third sub-step of detecting a failure in each of said total of m current sensors provided to correspond to each of said m phases by combining failure information obtained by performing said first and second sub-steps.

7. The failure check method according to claim 4, wherein said third step has a step of selecting one or two phases through which phase currents flow so as not to overlap a phase through which phase currents have already flowed when the first and second steps are repeated.

8. The failure check method according to claim 5, wherein said third step has a step of selecting a combination of two phases through which phase current flow so as not to overlap a combination of phases through which phase currents have already flowed when the first and second steps are repeated.

9. The failure check method according to claim 4, further comprising:

a fifth step of performing said first, second, third and fourth steps in that order after checking that a user has not operated to make said AC motor usable.

10. The failure check method according to claim 5, further comprising:

a fifth step of performing said first, second, third and fourth steps in that order after checking that a user has not operated to make said AC motor usable.

11. The failure check method according to claim 9, wherein said AC motor is a drive motor for an electric vehicle, and when it is checked that a parking brake is locked, it is determined that the user has not operated to make said AC motor usable.

12. The failure check method according to claim 10, wherein said AC motor is a drive motor for an electric vehicle, and when it is checked that a parking brake is locked, it is determined that the user has not operated to make said AC motor usable.

13. The failure check method according to claim 4, wherein said AC motor has balanced m phases, and said fail check method has a step of judging that said AC motor can be permitted to drive when at least m−1 current sensors among said m current sensors are normal.

14. The failure check method according to claim 5, wherein said m phase AC motor has balanced m phases, and said failure check method has a step of judging that said AC motor can be permitted to drive when at least m−1 current sensors among said m current sensors are normal.

* * * * *